(12) United States Patent
Paull (10) Patent No.: US 7,875,792 B2
(45) Date of Patent: Jan. 25, 2011

(54) APPARATUS AND METHOD FOR FORMING A PHOTOVOLTAIC DEVICE

(75) Inventor: James B. Paull, Andover, MA (US)

(73) Assignee: Stellaris Corporation, North Billerica, MA (US)

(*) Notice: Subject to any disclaimer, the term of this patent is extended or adjusted under 35 U.S.C. 154(b) by 790 days.

(21) Appl. No.: 11/773,866

(22) Filed: Jul. 5, 2007

(65) Prior Publication Data

US 2008/0053515 A1 Mar. 6, 2008

Related U.S. Application Data

(60) Provisional application No. 60/818,636, filed on Jul. 5, 2006.

(51) Int. Cl.
*H01L 31/0203* (2006.01)
*H01L 31/0232* (2006.01)

(52) U.S. Cl. .................. 136/246; 136/251; 136/244; 438/64; 438/66

(58) Field of Classification Search ............... 136/246, 136/252–265
See application file for complete search history.

(56) References Cited

U.S. PATENT DOCUMENTS

| | | | |
|---|---|---|---|
| 4,169,738 A | 10/1979 | Luque | |
| 4,191,593 A | 3/1980 | Cacheux | |
| 5,167,724 A | 12/1992 | Chiang | |
| 5,282,902 A | 2/1994 | Matsuyama | |
| 5,336,097 A | 8/1994 | Williamson et al. | |
| 5,538,563 A * | 7/1996 | Finkl | 136/246 |
| 6,091,017 A | 7/2000 | Stern | |
| 6,606,184 B2 * | 8/2003 | Guarr et al. | 359/265 |
| 6,639,733 B2 | 10/2003 | Minano et al. | |
| 6,700,054 B2 * | 3/2004 | Cherney et al. | 136/246 |
| 7,238,878 B2 * | 7/2007 | Gonsiorawski | 136/246 |
| 7,368,656 B2 * | 5/2008 | Boulanger | 136/246 |
| 2003/0201007 A1 | 10/2003 | Fraas et al. | |
| 2004/0134531 A1 * | 7/2004 | Habraken et al. | 136/246 |
| 2005/0081908 A1 * | 4/2005 | Stewart | 136/246 |
| 2005/0081909 A1 | 4/2005 | Paull | |
| 2006/0185713 A1 * | 8/2006 | Mook, Jr. | 136/244 |
| 2006/0235717 A1 | 10/2006 | Sharma et al. | |
| 2006/0283495 A1 | 12/2006 | Gibson | |
| 2007/0056626 A1 | 3/2007 | Funcell | |

(Continued)

OTHER PUBLICATIONS

Plastics International, datasheet, downloaded from www.plasticsintl.com/datasheets on Apr. 7, 2010.*

(Continued)

*Primary Examiner*—Jennifer K Michener
*Assistant Examiner*—Jayne Mershon
(74) *Attorney, Agent, or Firm*—Grossman, Tucker, Perreault & Pfleger, PLLC (57) ABSTRACT

The present disclosure relates to a device for concentrating light onto a photovoltaic target. In one embodiment, the device may include a transparent concentrating lens having an outside surface and a top and bottom portion wherein the bottom portion may be configured to receive concentrated light. A photovoltaic strip including a conducting strip are then provided along with film adhered to at least a portion of the outside surface of the concentrating lens wherein the film engages the lens and positions the photovoltaic strip at the lens bottom portion. A dielectric fluid may then be located between the lens and the film.

24 Claims, 11 Drawing Sheets

U.S. PATENT DOCUMENTS

2007/0095386 A1   5/2007   Gibson
2007/0157963 A1   7/2007   Metten et al.
2007/0193620 A1*  8/2007   Hines et al. ................. 136/246

OTHER PUBLICATIONS

The International Association for the Properties of Water and Steam, Release on the Refractive Index of Ordinary Water Substance as a Function of Wavelength, Temperature and Pressure, pp. 1-7, 1997.*

International Search Report dated Jan. 28, 2010 issued in related International Patent Application No. PCT/US09/67727.

International Search Report and Written Opinion dated Sep. 9, 2009 issued in related International Patent Application No. PCT/US2009/050908.

International Search Report and Written Opinion dated Dec. 18, 2007 issued in International Patent Application No. PCT/US07/72875 (9 pages).

* cited by examiner

APPARATUS AND METHOD FOR FORMING A PHOTOVOLTAIC DEVICE

CROSS-REFERENCE TO RELATED APPLICATIONS

This application claims the benefit of U.S. Provisional Application 60/818,636 filed Jul. 5, 2006.

BACKGROUND

Photovoltaic modules, as they are typically installed outdoors, must be constructed to withstand extremes in environmental conditions in order to continue to generate electricity reliably over a long period of time. Moreover, there are other design concerns specific to certain photovoltaic modules that use lenses to concentrate sunlight.

Photovoltaic modules can generate relatively high voltage and may need to be effectively insulated from their surroundings. Moreover, as solar modules are usually installed outside, the material may need protection from the elements such as water vapor, which may be especially important with thin film photovoltaics such as copper indium gallium di-selenide (CIGS) as this and similar photovoltaic materials and their electrical contacts are subject to degradation in the presence of water vapor. Also, as the photovoltaic material and concentrating lenses typically have significantly different coefficients of thermal expansion, there must be a means to accommodate their relative displacement vis-á-vis each other when a photovoltaic module is heated. To effectively harness the current that is produced by the photovoltaic material, a means may be necessary to draw the current off of the top of the photovoltaic material without excessive electrical resistance. Finally, a concentrating lens assembly should ensure optimum light transmission from the bottom of the concentrating lens to the photovoltaic and to minimize the amount of shading caused by a conducting grid on the surface of the photovoltaic.

SUMMARY

The present disclosure relates in one exemplary embodiment to a device and/or method for concentrating light onto a photovoltaic target. The device may therefore include a transparent concentrating lens having an outside surface and a top and bottom portion wherein the bottom portion is configured to receive concentrated light. A photovoltaic strip including a conducting strip may then be provided along with a film adhered to at least a portion of the outside surface of the concentrating lens. The film may therefore engage with the lens and position the photovoltaic strip at the lens bottom portion.

In another exemplary embodiment the present disclosure again relates to a device for concentrating light onto a photovoltaic target. The device may again include a transparent concentrating lens having a refractive index and having an outside surface and a top and bottom portion, wherein the bottom portion is configured to receive concentrated light. A photovoltaic strip including a conducting strip may then be provided along with a transparent film adhered to at least a portion of the outside surface of the concentrating lens wherein the film engages with the lens and positions the photovoltaic strip at the lens bottom portion. A transparent dielectric fluid may then be located between the lens and said film, wherein the dielectric fluid has a refractive index that is within +/−20% of the refractive index of the lens.

In still further exemplary embodiment, the present disclosure relates to a device for concentrating light onto a photovoltaic target that includes a transparent concentrating lens having an outside surface and a top and bottom portion wherein the bottom portion may be configured to receive concentrated light and wherein the bottom portion includes an opening. A photovoltaic strip including a conducting strip may then be positioned in the opening wherein the opening is sealed and is capable of containing a dielectric fluid.

In yet another exemplary embodiment, the present disclosure relates to a method of forming a photovoltaic device. The method includes providing a concentrating lens including a transparent material and having an outside surface and providing a photovoltaic strip including a conducting strip. This may then be followed by adhering a film to at least a portion of the outside surface of said concentrating lens wherein the film positions the photovoltaic strip at said bottom location of said concentration lens.

BRIEF DESCRIPTION OF THE DRAWINGS

These and other objects, features and advantages of the present invention will become apparent to those skilled in the art upon reference to the following written description and accompanying drawings.

DETAILED DESCRIPTION

Figure 1:
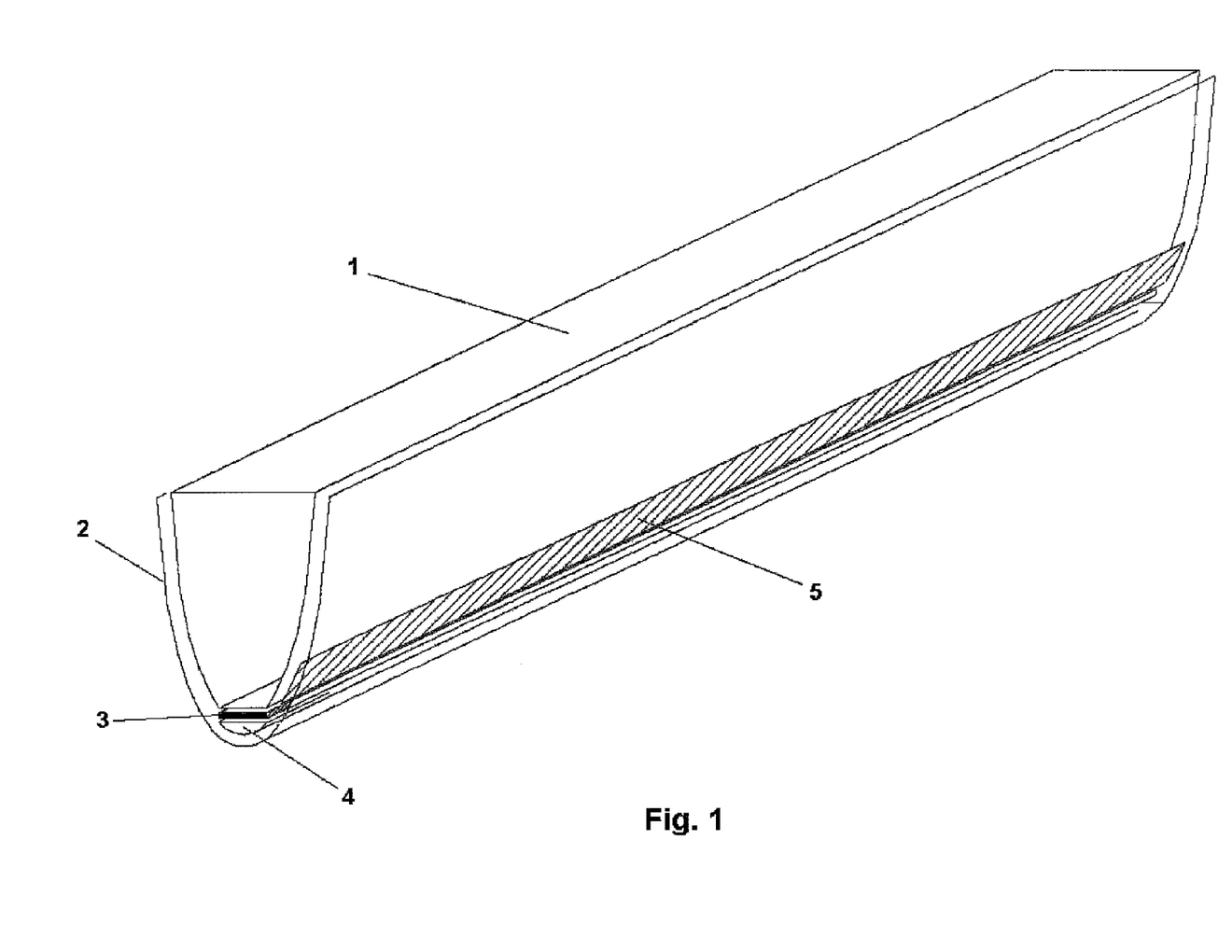
FIG. 1 is a schematic exploded orthogonal view of an exemplary photovoltaic assembly.
Figure 2A:
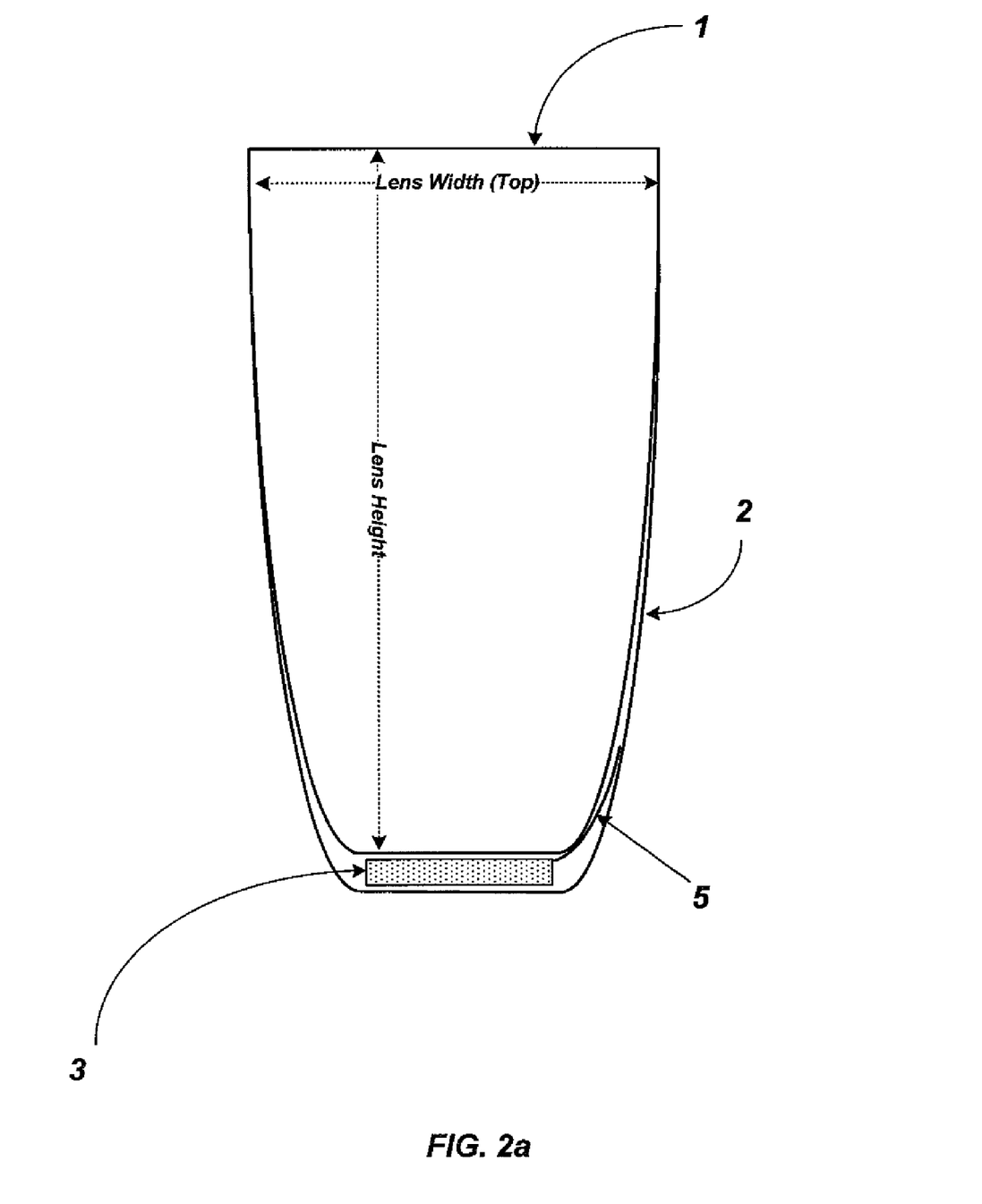
FIG. 2a is a cross-sectional view of photovoltaic assembly in the absence of a backing strip.
Figure 2B:
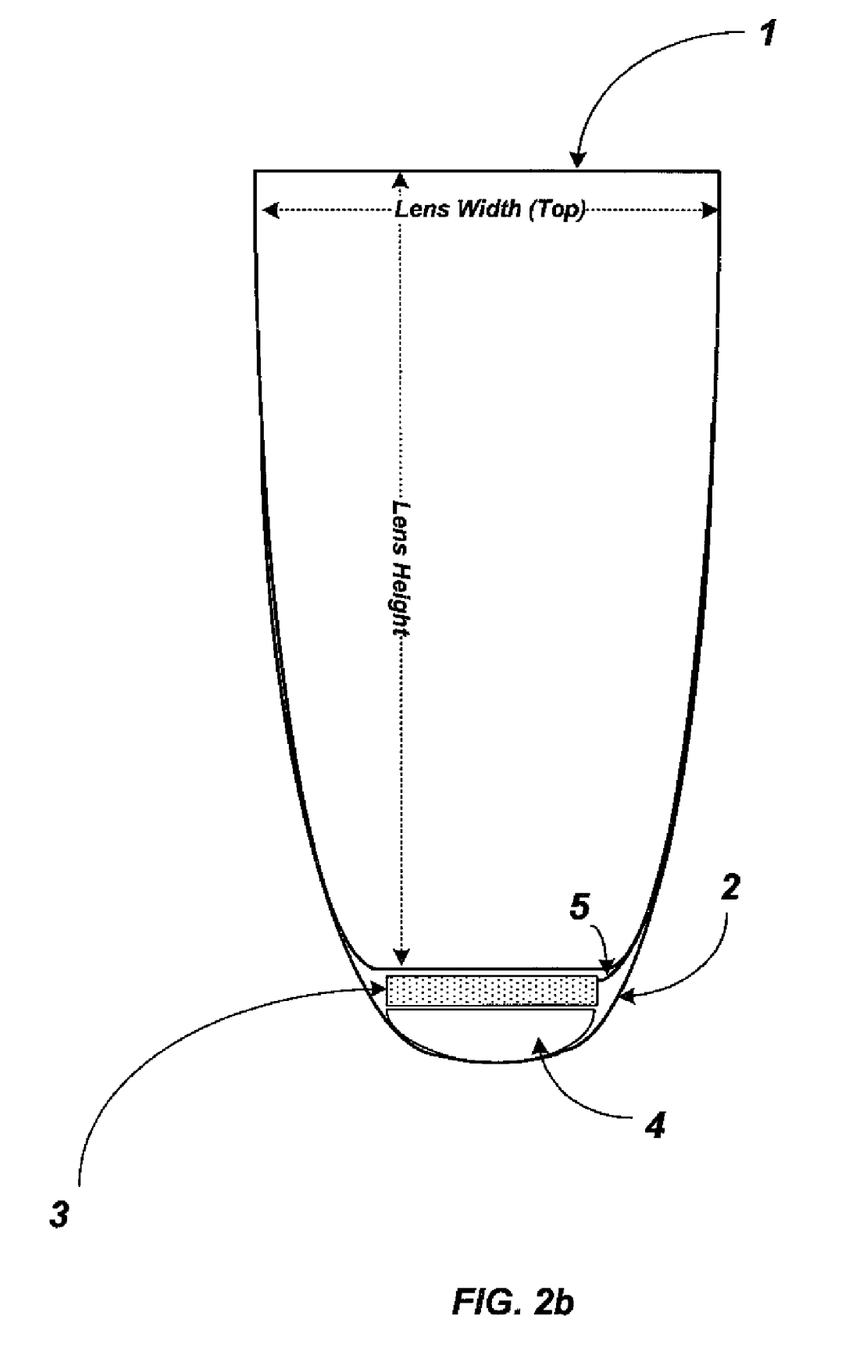
FIG. 2b is a cross-sectional view of the photovoltaic assembly of FIG. 1.
Figure 3:
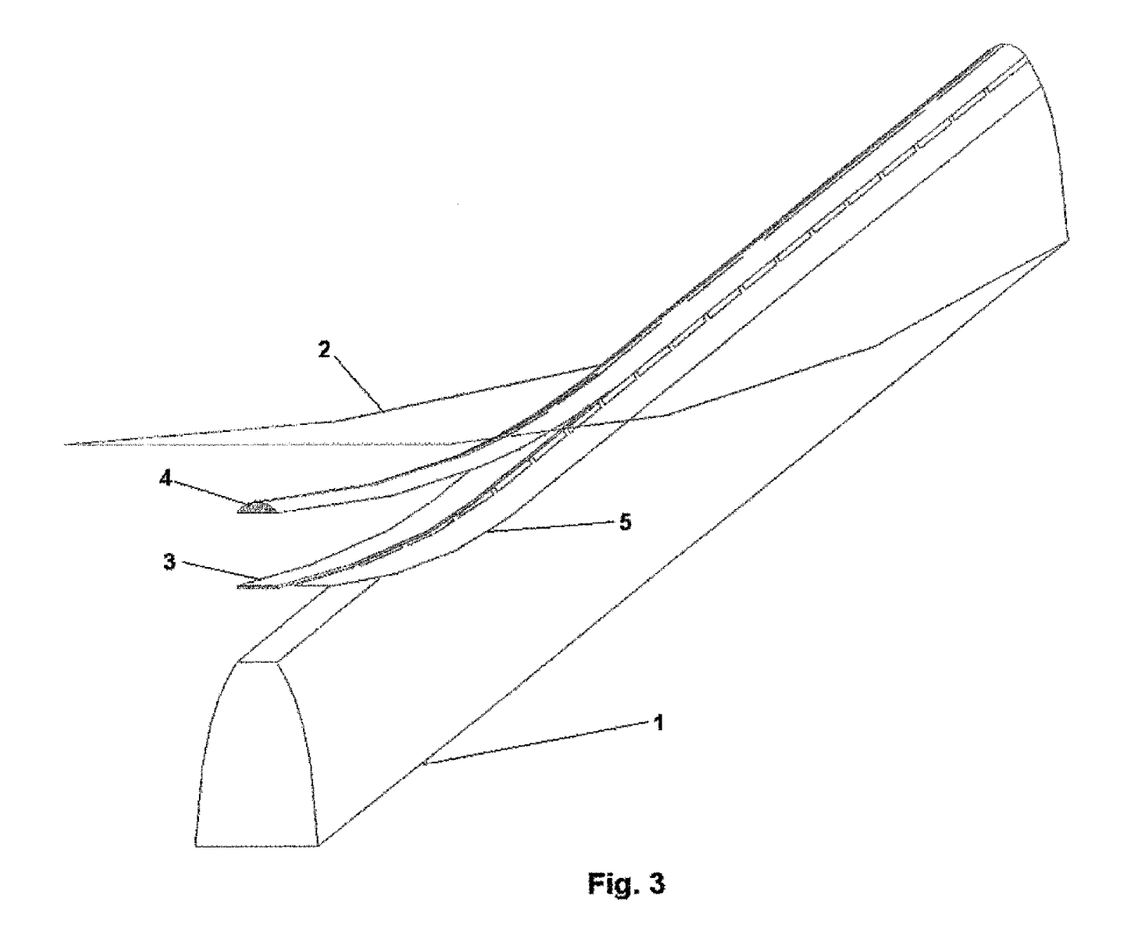
FIG. 3 is a schematic exploded orthogonal view illustrating how the photovoltaic assembly may be assembled.

FIGS. 1-3 detail representative features of an exemplary photovoltaic assembly according to the present disclosure. For clarity, one photovoltaic assembly is illustrated in FIG. 1. It may be appreciated that a plurality of such photovoltaic assemblies may be employed on a given module in application, e.g., 500-1000, which may be dictated by power requirements.

The concentrating lens 1 with an elongated shape generally as shown in FIGS. 1-3 in a preferred embodiment may be made from transparent polymer resin material. Reference to a concentrating lens 1 may be understood as any lens that is capable of directing light of a given wavelength or range of wavelengths to a given location. Transparent polymer resin material may be understood as a material herein that transmits light sufficient for the photovoltaic material (described more fully below) to absorb light and generate electrons. For example, transparent material herein may transmit 50% or more of visible light, including all values and increments between 50-100%. For example, such materials may include acrylic, polycarbonate, polyethylene terepthalate (PET), cellulosic esters, polystyrene, nylons, poly-4-methyl-1-pentene, etc. The transparent material may also include those polymeric materials that are primarily amorphous (e.g. greater than 50% amorphous content) and which have a glass transition temperature (Tg) of above about 50° C. The transparent materials contemplated herein may also include glass.

A strip of photovoltaic material 3 of substantially the same width at the bottom of the concentrating lens 1 may be positioned along the bottom of the lens so as to receive the concentrated light. Reference to concentrated light may therefore be understood as light that has entered the lens assembly and is then directed to the bottom photovoltaic strip. Such positioning may therefore be achieved via film material 2 as described more fully below. The width of the photovoltaic strip may therefore be 75-120% of the width of the bottom of the lens. As may be appreciated, ultimately, this width may be selected to optimize the efficiency of the photovoltaic strip when it comes to interaction with light photons and electron generation and production of electricity. As therefore shown in the exemplary illustrations, the bottom of the lens 1 may be substantially flat.

The photovoltaic material may include a light-absorbing material to absorb photons and generate electrons via a photovoltaic effect. The photovoltaic material may therefore include what may be described as a thin-film photovoltaic, which may be understood as inorganic layers, organic dyes and organic polymers deposited on a supporting substrate. For example, the thin film photovoltaic may include an inorganic material such as copper indium gallium di-selenide (CIGS). It may also include amorphous silicon thin-film photovoltaic materials. One may also use mono or polycrystalline silicon photovoltaic materials. It may therefore be appreciated that the photovoltaic material 3 may also be deposited directly on the concentrating lens 1 by methods such as sputtering and/or vacuum deposition.

As next shown in FIGS. 2a and 2b, the photovoltaic material 3 may optionally include a backing strip 4 (FIG. 2b). The backing strip may be made of shaped electrically conductive wire, such as copper or aluminum, but in other embodiments it may be made of synthetic material such as polymeric material or other solid material. The backing strip 4 may provide a number of additional useful functions. For example, during manufacturing, it may provide a method of further securing the photovoltaic strip 3 to the lens 1. The backing strip 4 and the photovoltaic material 3 may therefore be joined together by a temporary adhesive such as artwork mounting adhesive, or in other embodiments by a magnetic field if the backing strip and photovoltaic materials both have magnetic properties.

The backing strip 4 may preferably be curved on one side which side engages with film material 2 as also schematically illustrated in FIG. 2b. It may be appreciated that such curvature may provide a general continuity to the curve of the laminating film 2 that may be used to wrap all or a portion of the outer surface of the concentrating lens 1. This may be important in order to ensure that the film does not distort the optics of the concentrating lens 1. It may also be important in ensuring that the backing strip 4 and the photovoltaic material 3 are held relatively closely to the concentrating lens 1 and are supported by the transparent laminating film 2 so that the photovoltaic strip 3 remains at the indicated location.

Another function of the backing strip 4 may be to provide a means of thermal conductivity to remove heat from the photovoltaic material 3. Accordingly, the backing strip 4 may be, for instance, a metallic material such as copper (401 Watts/m-k) or aluminum (237 Watts/m-k) both with relatively high thermal conductivity. In general, any metallic material with a thermal conductivity of over 50 Watts/m-K is contemplated for use herein. By being in relative contact or close proximity to the photovoltaic material, the backing strip may be able to draw heat away from the photovoltaic. In addition, because its bottom surface may be curved, it may afford additional area to transfer heat to the surrounding air. Moreover, as the assembly of the concentrating lens 1 and the backing strip 4 may form a shape conducive to promoting air turbulence and enhancing convective film heat transfer coefficients, the strip may further serve to dispel unwanted heat from the photovoltaic material that may have a deleterious effect on its performance.

Yet another feature of the backing strip 4 may be to serve as an electrical conductor for the positive (bottom) side of the photovoltaic material 3. In the illustrated embodiment, the metallic back of the photovoltaic material may be electrically connected at one or more locations to a metallic backing strip by an electrically conductive adhesive, such as silver epoxy. In other embodiments, other electrically conductive materials may be used or the electrical contact may depend on physical contact between the materials. Furthermore, another feature of the backing strip 4 may be to provide support for an electrical inter-connection at the end the assembly by extending at least slightly beyond one or both ends of the concentrating lens 1. An example of this is provided in FIGS. 5-6 and the discussion provided below.

Again referring to FIGS. 1-3, a film 2, for instance, may be used to laminate the assembly together. Accordingly, film material may be understood as any material that may be adhered to the lens and serve to locate and position the photovoltaic strip as noted above. The film may have a thickness of about 0.050 mm to about 0.250 mm. The film may be transparent, which may be understood as noted above in the context of the lens material 1. Exemplary film material may again include polymeric material, e.g. acrylics, polyester, polycarbonates, cellulosics, etc. Furthermore, the film may have a light transmission capability that is within +/−10% of the light transmission capability of material used in the lens to provide optical coupling. For example, for an acrylic lens that may transmit about 92% of visible light, the film material may transmit about 82.8-100% of visible light, including all values and increments therein. In addition, the refractive index (Ri) of the film material 2 may also be within +/−10% of the refractive index of the lens material 1. Once again, by way of example, for acrylic lens material 1 having a refractive index of about 1.49, the refractive index of the film material 2 may be about 1.34-1.64, including all values and increments therein. In addition, it is contemplated herein that the film material may be selected and applied to the lens such that it may provide total internal reflection (TIR). For example, the film may be applied to the lens and provide an air gap thereby leading to TIR of light. On the other hand, if the film is adhered to the lens and it provides continuity of refractive index, it will not reflect internally. In any of these embodiments, the film material may still locate the photovoltaic strip 3 at the bottom of the lens. In addition, the film may be configured such that it may provide TIR yet not be transparent to a given observer.

The film material 2 may be adhered to at least a portion of the two curved sides of the concentrating lens 1. This may be accomplished by a variety of techniques. For example, one may adhere the film to the lens utilizing a heat source (hot air or infrared radiation), and improve the efficiency of bonding by utilizing a heat absorbing dye. In addition, one may adhere the film to the lens utilizing techniques such as ultrasonic welding or through the use of laser treatment. In addition, one may also utilize a transparent (as defined above) adhesive such as an acrylic based adhesive which adhesive may be provided as a solvent based formulation. The solvent based adhesive may then adhere the film and the lens together, thereby eliminating any boundary and making the two substantially homogeneous with respect to optical characteristics.

The transparent outer surface of the film 2 may be selected such that although transparent to an observer, it also provides total internal reflection (TIR) of the light passing through the lens and interacting with the photovoltaic strip 3. Accordingly, the present disclosure contemplates the use of a flexible transparent material that may be adhered to the lens and wrap about a portion of the lens and provide TIR. Attention is therefore directed to FIG. 3 where the film 2 is shown as conforming to one end of the concentrating lens 1, while being extended over the remainder of the lens 1. The film may then be applied so that it may encompass the photovoltaic material 3, backing strip 4 and side strip 5. Thus, the application of the film 2, by being adhered to at least a portion of the surfaces of the lens 1 may be understood to contain and locate the components.

The transparent film used in conjunction with the transparent lens may have certain optical characteristics, such as when using a non-imaging compound parabolic concentrator for the lens component. This may then allow light incident on the lens, at certain oblique angles (i.e. angles other than 90 degrees with respect to the upper horizontal surface of the lens), to pass through without hitting the photovoltaic target. Conversely, certain light traveling in an opposite direction through the lens may be reflected/refracted from the upper surface of the lens at oblique angles. The transparency of the film and lens herein therefore may allow unique visual effects for such building components as skylights, windows, roofing and certain wall configurations, including daylighting (passage of light) and/or offering the appearance of a background color and texture to an observer while concurrently concentrating the light to the photovoltaic 3 to generate electricity.

It should also be appreciated that the above referenced use of a transparent solvent based adhesive may also serve to reduce the number of optical imperfections that might have separately occurred in the manufacture of the concentrating lens 1. In addition, the film 2 is preferably not adhered to the lens assembly at the bottom of the lens (e.g. in the area of the backing strip) which may then allow for independent expansion and contraction of the photovoltaic material 3, optional backing strip 4 and side conducting or conducting/reflecting strip 5 as described below. Accordingly, it may be appreciated that the film 2 may also be selectively adhered to the outer surfaces of the lens 1, and need only be adhered a sufficient amount so that it may extend about the bottom of the lens to contain the components as noted above.

In another exemplary embodiment, the film 2 may again be adhered to only a portion of the entire area of the sides of the concentrating lens 1, and utilize a dielectric fluid or gel to provide optical continuity between the concentrating lens 1 and the laminating film 2 in those areas that are not fused together. Such fluids or gels may therefore have molecular weights (MW) of less than or equal to about 15,000. Accordingly, reference to a dielectric fluid herein may be understood as any electrically non-conductive material that may be made to flow with applied pressure at temperatures of less than about 50° C. and position itself between the lens 1 and photovoltaic 3, and if present, backing material 4. This fluid component in the concentrating lens assembly may specifically be a transparent dielectric fluid, wherein transparent is, similar to the above, reference to a flowable material that transmits light sufficient for the photovoltaic material to absorb light and generate electrons. For example, the transparent flowable material, similar to the transparent film material 2, may transmit 50% or more of visible light, including all values and increments between 50-100%. The fluid component may also transmit light at a value of +/−10% of the transmission of visible light provided by the lens 1 and/or film 2.

The dielectric fluid may specifically be, e.g., mineral oil, e.g. a paraffin oil or low molecular weight hydrocarbon or a grease and/or wax having a molecular weight, as noted above, of less than or equal to about 15,000. It may also include glycerin, but other types of transparent oils, fluids or gels are contemplated herein, including vegetable oils (oils sourced from plants). The encapsulating fluid may also have refractive index that is equal to or within about +/−20% of the value of the refractive index of the lens 1 and/or film 2. The dielectric fluid may also be generally hydrophobic which may be understood as a fluid that is not miscible with water. For example, the fluid may include a silicon based fluid, e.g., a fluid based upon a relatively lower molecular weight polysiloxane (e.g. polydimethylsiloxane or PDMS) having a number average molecular weight (Mn) of equal to or less than about 5000. In addition, such fluids may provide thermal stability over the temperatures of application (e.g. −50° C. to about 125° C.) and avoid gellation. In addition, it is contemplated herein that the fluid may be selected such that it has a relatively low permeability to diffusion of water. Fluids resulting in a water vapor transmission rate (WVTR) of less than or equal to 0.5 g/m$^2$-day at 25° C. and 50% relative humidity may therefore provide superior protection again corrosion of the photovoltaic material by water vapor. In addition, it is contemplated that one may apply a water barrier coating to the film to further reduce water permeability. Such coating may also be transparent, and may be sourced in polymeric resins such as polyurethanes, acrylics, etc.

The transparent dielectric fluid may therefore be incorporated into what may be understood as a pocket at the bottom of the concentrating lens 1 assembly and may occupy any space where the transparent laminating film 2 is not adhered to the concentrating lens 1. The fluid may also be introduced into such pocket at a positive pressure which may provide improved coating of the components therein. By coating the surfaces of the photovoltaic strip 3 and the backing strip 4, such dielectric fluid may also: (a) provide optical coupling between the bottom of the concentrating lens 1 and the photovoltaic strip 3; (b) provide lubrication of the surfaces of the lens 1, photovoltaic strip 3 and optional backing strip 4 so they may independently expand and contract when subjected to heat; (c) provide electrical insulation of the electrical conductors from the outside environment; (d) reduce the ingress of moisture from the outside environment; and (e) provide a thin liquid film type coating between the concentrating lens 1 and the photovoltaic strip as described above.

It may now be appreciated that the electrical output of the photovoltaic cells may therefore be enhanced by incorporating a transparent dielectric fluid between a photovoltaic strip and its transparent lens or cover. This specifically may include photovoltaic devices having enhanced performance fabricated in accordance with such methods. Specifically, it has been found that the electric output power of photovoltaic devices disclosed herein, such as solar photovoltaic cells, may be enhanced by incorporating a dielectric fluid as described herein between a solar module's transparent cover or lens and the photovoltaic material itself.

The output wattage of such fluid enhanced photovoltaic devices may exceed the output wattage of the same photovoltaic devices without fluid by a range of approximately 4 to 17%. Results may be improved further when the pocket (the area at the bottom of the lens surrounded by film) is completely filled with fluid which may ensure improved contact between the fluid and the indicated components (photovoltaic strip 3, optional backing strip 4 and the conducting strip 5). This is specifically the case when the photovoltaic assembly herein is employed as a solar photovoltaic device.

The upper (negative) surface of the photovoltaic 3 may be connected electrically to a conducting bus strip 5 that may optionally serve as a reflector. The electrically conductive transparent layer often used on the upper surfaces of photovoltaics which are often made of indium tin oxide, may offer considerable electrical resistance. Moreover, a conducting grid is typically laid on the surface to further minimize the electrical resistance of conducting electricity off of the upper surface of the photovoltaic. In doing so however, the conducting grid may shade part of the photovoltaic material, rendering that part ineffective in producing electricity.

In the present disclosure, the lens 1 may be three-dimensional, as illustrated in FIG. 1. The lens may therefore have a height of 5-20 mm, including all values and increments therein. For example, the lens may have a height of about 10 mm. The lens width at about the top of the lens may be about 4-8 mm, including all values and increments therein. For example, the lens width at the top of the lens may be about 6 mm. The lens width at the bottom of the lens (given that the lens has a taper) may be about 1-3 mm, including all values and increments therein. For example, the lens width at the bottom of the lens may be about 2 mm.

In the present disclosure however, because the concentrating lens is three-dimensional rather than two-dimensional, all or a portion of the conducting grid/bus 5 can be positioned outside the direct path of light, which may then reduce the amount of shading to the photovoltaic 3 and which may also free up more area of photovoltaic for electricity generation. As can be seen e.g. in FIG. 2a, the conducting strip 5 may be extended from the bottom portion of the lens 1 where it is connected to the top surface of the photovoltaic strip 3 into a location along the side portion of the lens 1.

Figure 4:
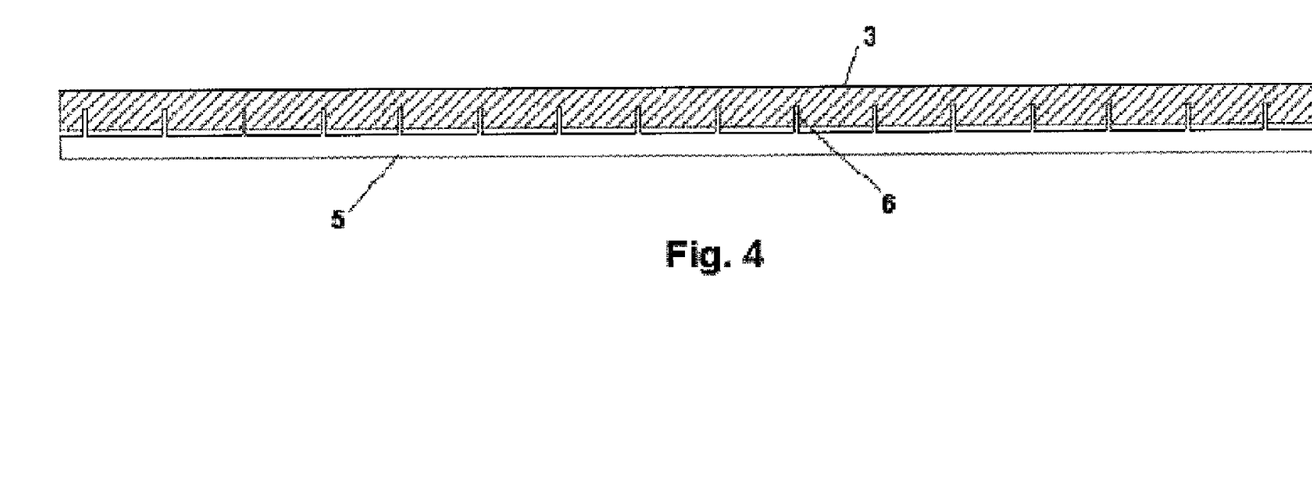
FIG. 4 is a plan view of an exemplary photovoltaic strip and the conductive strip which conductive strip may optionally be reflective.

FIG. 4 is a plan view of the photovoltaic strip 3 and the conducting bus strip 5. Also illustrated are the individual branch connections 6 that may be electrically attached to the conducting strip 5. In the exemplary illustration, the branches of the conducting strip 5 may be electrically connected to the photovoltaic strip 3 with silver epoxy. Because of the narrow geometry of the photovoltaic strip, the branches 6 also may not need to extend all the way across the strip 3 in order to minimize electrical resistance, further reducing the amount of shading of the conducting grid of the photovoltaic.

As alluded to above, the conducting bus strip 5 may also be reflective, and may therefore be made from a reflective material such as polished aluminum foil. If an air gap is provided and made to exist between the concentrating lens 1 and the conducting/reflecting strip 5, the difference in refractive index between the acrylic and the air may also separately cause total internal reflection within the concentrating lens 1. If, on the other hand, there is continuity in the refractive index of materials, such as would be the case if there were a transparent fluid of comparable refractive index placed intermediate to the lens and what may then be described as a conducting/reflecting foil, then the light may not internally reflect with the concentrating lens 1 but may continue on to the polished surface of the conducting/reflecting foil 5, which would itself may then provide a desired reflection.

While conducting and/or conducting/reflecting bus strips 5 may be used on both sides of the concentrating lens assembly, there may be a benefit to using only one bus strip 5. This exemplary embodiment may provide the ability of the concentrating lens 1 to pass incidental light outside of the range of angles of incident light that is useful in generating electrical power. This may afford the opportunity for the concentrator to pass daylight into a building while at the same time producing electricity, or allowing an observer at selected (e.g. relatively lower) angles to perceive colors and texture through the photovoltaic module assembly. By therefore placing the bus strip 5 on only one side of the concentrating lens assembly, there may be one side of the concentrating lens assembly that will not impede this daylighting or visual effects and the solar photovoltaic module can be oriented according to such construction.

Figure 7A:
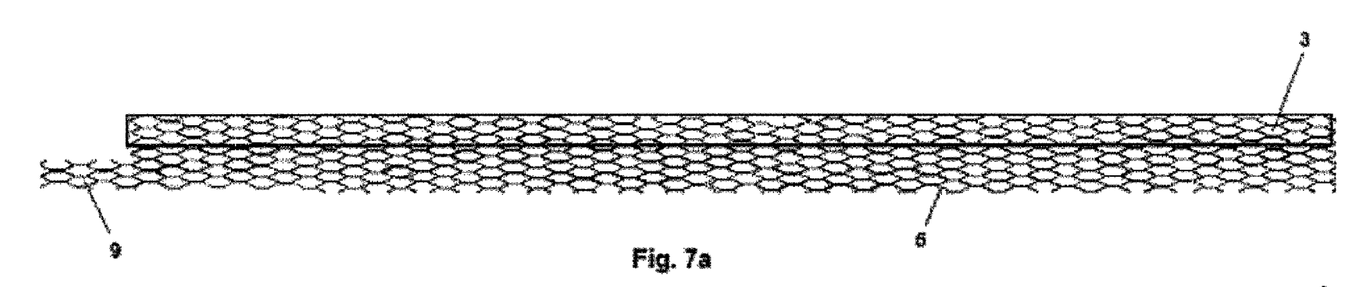
FIG. 7a is a plan view of another example of a conductive strip.

As noted above, the electrical contact to the top of the photovoltaic strip 5 is shown in FIGS. 2 and 4. The bus strip 5 along the side of the lens may be connected by metallic extensions 6 to the upper surface of the photovoltaic strip 3. Other variations for providing electrical contact are also possible by, for instance, using different shapes for the electrical contact on the top surface of the photovoltaic material. The contact may have various geometries, including expanded metal mesh. This expanded metal mesh 9, as shown in FIG. 7a may be copper or similar electrically conductive material, which has been expanded to provide open area to allow solar radiation to generate electricity on the surface of the photovoltaic strip 3, while at the same time allowing electrical conductivity paths along the surface of the metallic portion of the mesh 9. The copper mesh may be adhered to the top surface of the photovoltaic material 3 using electrically conductive adhesive or solder as is known to one skilled in the art.

The distribution of the electrical contact points on the top surface of the photovoltaic 3 may be such that the distance electricity has to travel in the photovoltaic material and the transparent conductive oxide on its surface may be optimized. This may reduce the sheet resistance losses in the photovoltaic. Moreover, by providing multiple conductive paths spaced close together with a conductive material such as copper, the tendency of current to flow through parts of the photovoltaic that offer less resistance than others may be minimized, which may be exacerbated by a reverse electrical bias on the cell that can arise when, for example, a solar cell becomes shaded or otherwise generates less current than other cells in series. This may be a problem in some types of photovoltaics and may lead to cell failure.

One example of the metallic mesh material 9 that might be used is 0.127 mm thick copper that provides about 90% open space (i.e. the metal occupying 10% of the surface area) and is rolled flat so that as much copper surface as possible can be in contact with the photovoltaic surface. The copper mesh 9 may be adhered to the photovoltaic 3 using, for instance, a conductive hot-melt or conductive epoxy adhesive.

Figures 7B, 7C:
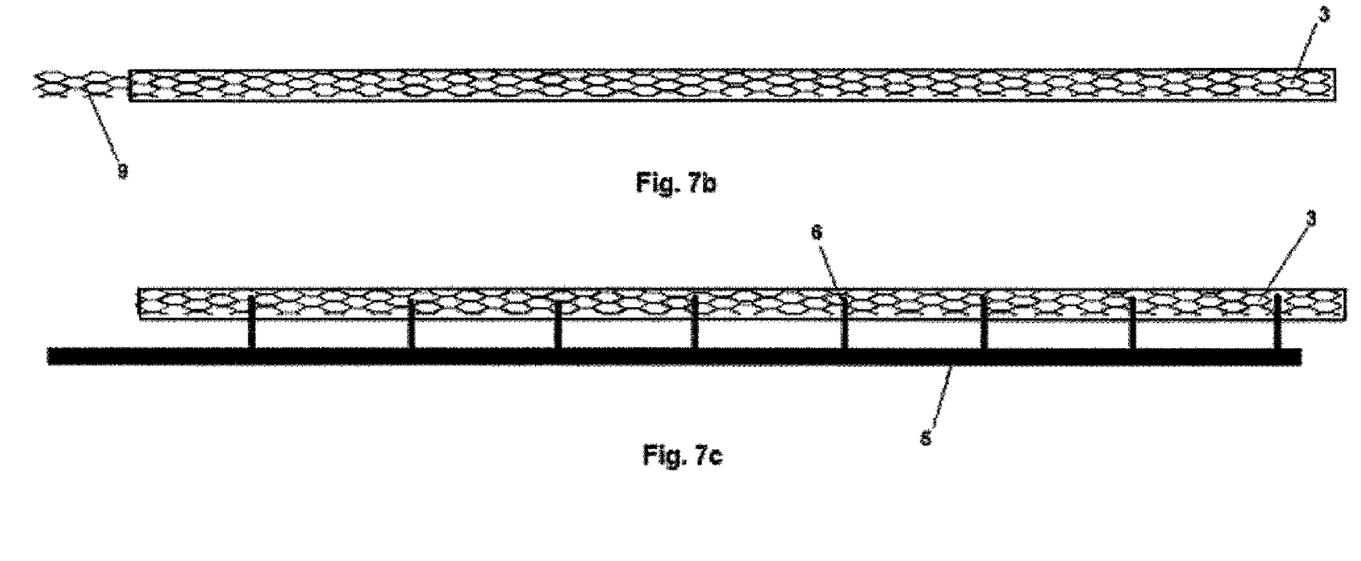
FIG. 7b is a plan view of yet another example of a conductive and/or reflective strip.
FIG. 7c is a plan view of yet another example of a conductive and/or reflective strip.

Three exemplary variations of the mesh contact are shown in FIGS. 7a, 7b and 7c. In FIG. 7a, the mesh 9 may serve as both the side bus contact 5 as well as providing the electrical contact to the photovoltaic. As can be seen in FIG. 7a, the mesh may overlie a portion of the photovoltaic strip 3 (not shown for clarity) and include extension 9. In FIG. 7b, instead of the bus contact 5 being located along the side of the lens 1, the mesh may again be extended at location 9 so that electrical bus connections can be made at one end of the lens 1. In a third variation, as shown in FIG. 7c, a side contact bus 5 may be joined to the mesh on the top of the photovoltaic by solder, adhesive or other acceptable means that will ensure relatively good mechanical and electrical connections.

Figure 5:
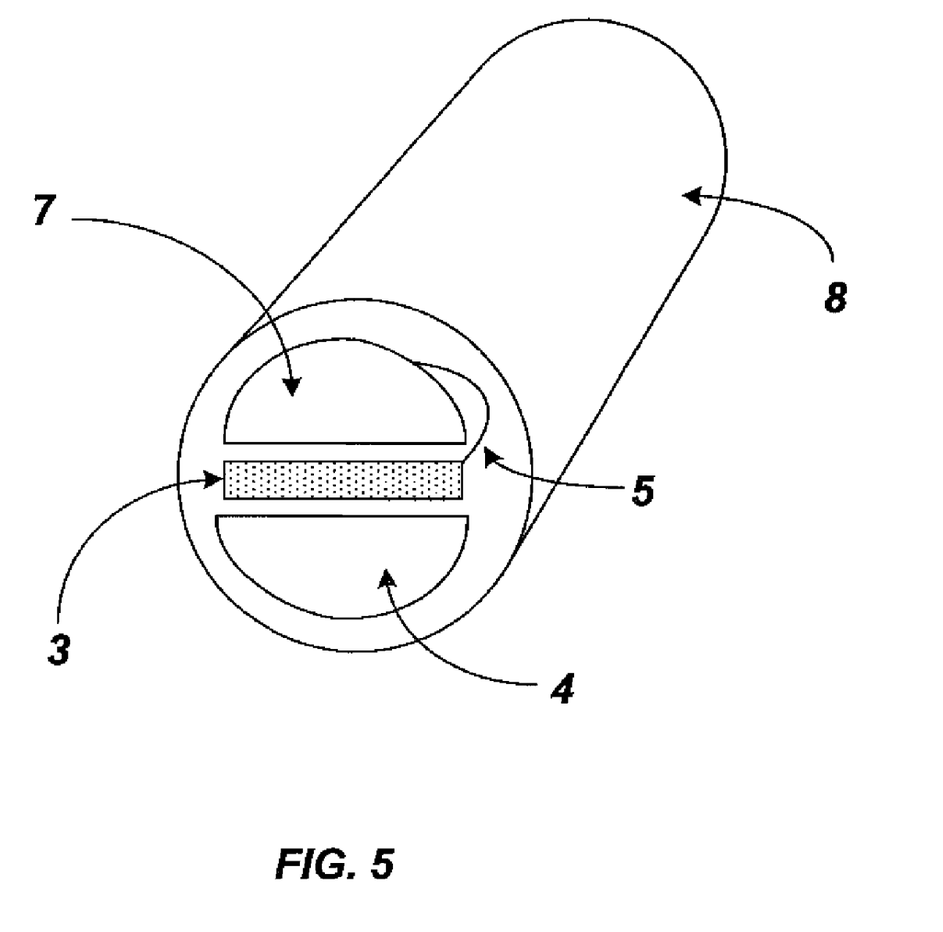
FIG. 5 is a schematic orthogonal view of exemplary terminal electrical conductor assembly.
Figure 6:
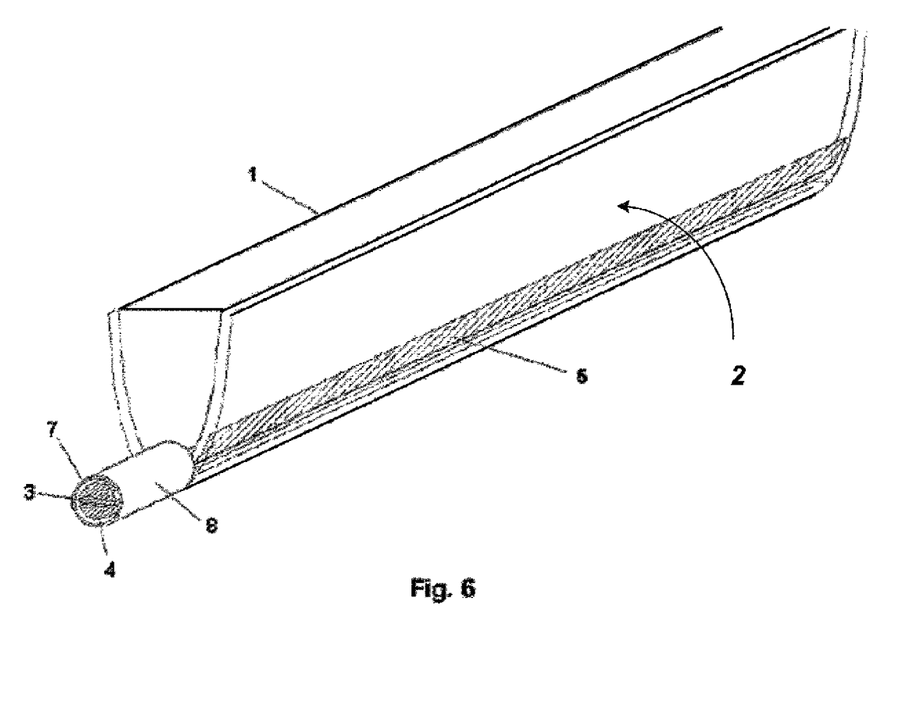
FIG. 6 is an orthogonal view of the exemplary terminal electrical conductor assembly as it may be attached to the photovoltaic assembly of this disclosure.

An additional structural feature of the exemplary photovoltaic assembly is the electrical connection that may be positioned at its end. FIG. 5 is an exemplary stand-alone view of the electrical connection assembly and FIG. 6 illustrates the assembly as it may be attached to the concentrating lens assembly. It should be noted that in FIG. 6, similar to FIG. 1, the film is not shown as adhered to the lens for clarity. In these figures, the backing strip 4 is shown as extending beyond the end of the concentrating lens 1 to provide a support for the electrical connection assembly. As described above, the backing strip 4 may be electrically connected to the bottom (positive) side of the photovoltaic strip 3. A short section of shaped metallic wire 7 may be positioned on top of the extended photovoltaic strip 3 such that the photovoltaic strip may be intermediate to the two metallic shaped wires. The shaped metallic wire 7 may be of the same material as, and similar shape to the backing strip 4.

An extended length of the conducting strip 5 may then be gathered, brought into electrical contact with the upper shaped wire contact 7, and joined electrically, in an exemplary embodiment, with silver epoxy. The extended ends (in lengthwise direction) of the film 2 may also be gathered together, and along with the components mentioned above, inserted inside a short section of tubing 8. When heated, the tubing 8 may also shrink to firmly retain the electrical connection components together and insulate them from an external environment. The tubing 8 may also be sized so that the shaped wire conductor 7 and backing strip 4 extend slightly beyond the shrink tubing, allowing solder or mechanical electrical connections to a common bus bar.

As can therefore be seen from the above, the present disclosure comprises in one exemplary embodiment an assembly including a concentrating lens constructed of a transparent material that may serve as the passively concentrating lens element, a laminating film fused to the lens, a photovoltaic strip, a transparent dielectric fluid, a metallic backing for the photovoltaic material, an electrical connection located at the end of the assembly, and one or more conducting strips (that may be reflecting) that may also serve as conducting leads off of the top surface of the photovoltaic.

In another embodiment, a strip of thin-film photovoltaic material, cut or sized to the width of the target area of the concentrating lens, may be laminated between the target area of the lens and a transparent thin film of substantially the same material as the lens, while a backing strip that serves to support the photovoltaic during the manufacturing process may also provide continuity of shape for the laminating film, and may act as a electrical conductor and support for the electrical connections at the end of the lens. Such backing strip may also serve to conduct heat away from the photovoltaic. Such lamination may then include a metallic electrically-conductive and light reflecting foil (e.g. thickness of about 0.01 mm to about 0.05 mm) with branches connected to the top surface of the photovoltaic at various intervals in order to draw the current from the top of the photovoltaic.

As noted above, the film may be adhered to the curved sides of the concentrating lens by using procedures such as solvent welding, ultrasonic welding, heat fusion or by laser fusion in conjunction with a light absorbing dye. When the film is fused to the element the material may become substantially homogeneous such that the total internal reflection is provided. At the bottom of the optical element, the film may wrap around the photovoltaic strip, a shaped support backing, the transparent dielectric fluid and the conducting foil, locating all of them in place in the assembly. This lamination may completely encapsulate these elements and also protect them from the environment.

After the lamination step, the transparent dielectric fluid may be supplied in the space occupied by the photovoltaic and the conducting or conducting/reflecting bus strip. The fluid may provide optical coupling between the lens and the upper surface of the photovoltaic, provide lubrication so that there can be differential expansion between the lens, the bus bar and the photovoltaic, and insulate electrically, and/or to provide additional protection to the photovoltaic from the adverse effects of water vapor and other environmental elements.

A shaped backing strip for the photovoltaic, which may be made of metal, may serve a number of purposes. It may provide support to the delicate thin film photovoltaic, both in the finished assembly and during manufacturing. In manufacturing, the photovoltaic strip may be attached to the metal backing piece using adhesive or magnetic attraction if that property is present in the photovoltaic, aligning the photovoltaic strip which then may make it feasible to handle in the manufacturing process. The back of the backing strip may be shaped such that the transparent film that is fused to the outside of the lens maintains a relatively continuous angle as it wraps around the photovoltaic, the backing strip, the dielectric fluid and the conductive foil, which may ensure the mechanical integrity of the assembly while also ensuring the formation of a desirable geometry for the concentrating optics. In addition, the backing strip may provide a means of thermally conducting heat away from the photovoltaic, and with its extended surface, serve as what may be considered as a radiator to dissipate heat to the surrounding air. However, it may be appreciated that the photovoltaic assembly without a backing strip may also be effective in eliminating heat. Specifically, the lenses themselves may serve as the heat radiation structure and act as fins to provide an amount of surface area for heat transfer as well as curved/angled shapes to enhance convective heat losses.

Figure 8:
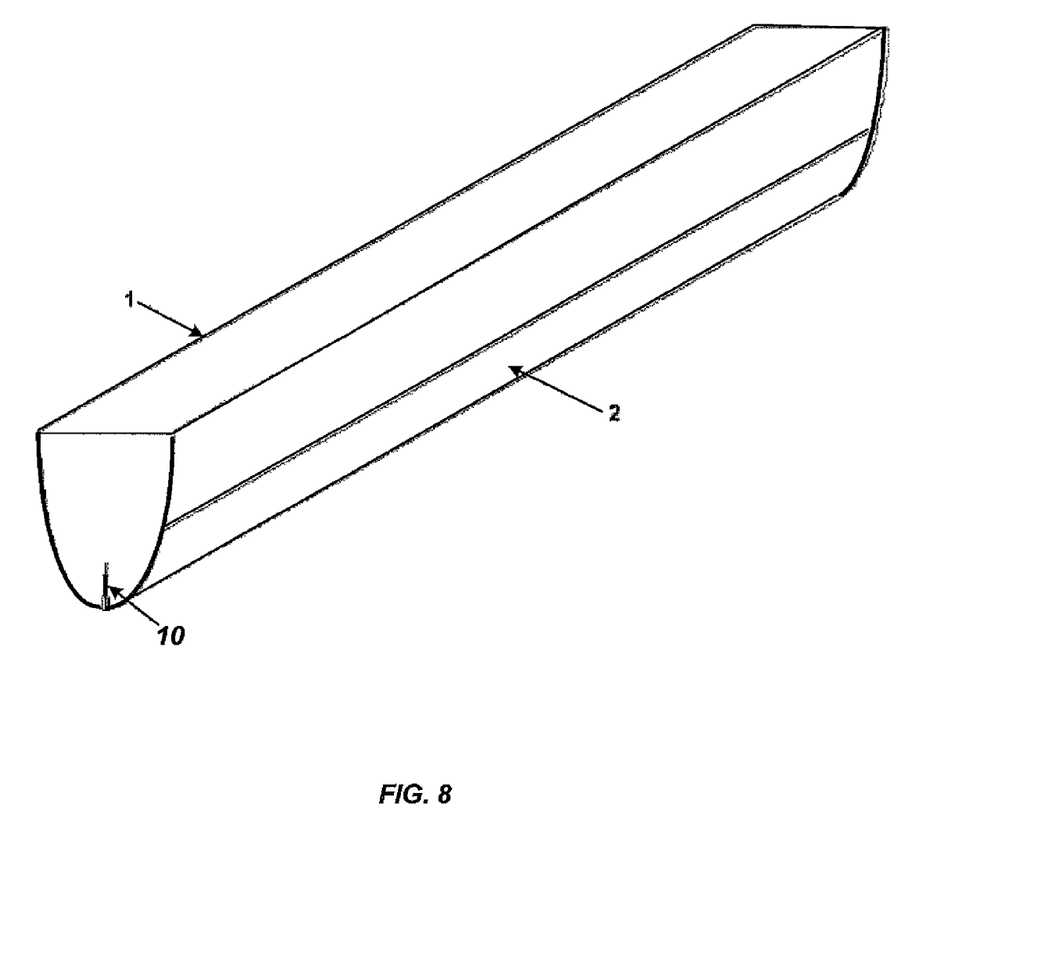
FIG. 8 is a schematic exploded orthogonal view of another exemplary photovoltaic assembly.
Figure 8A:
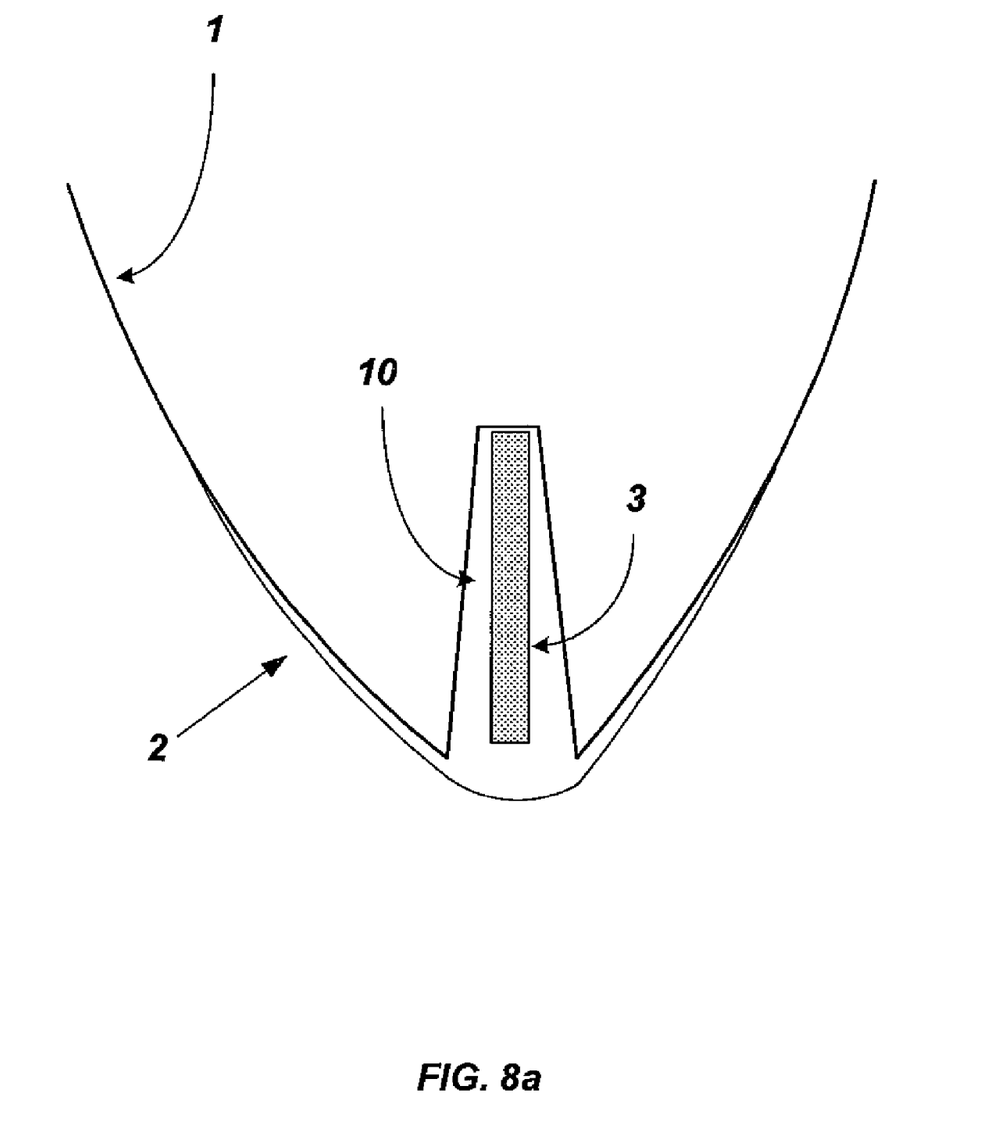
FIG. 8a is a cross-sectional view of the photovoltaic assembly of FIG. 8, wherein film may be employed to seal the indicated opening for the photovoltaic strip.
Figure 8B:
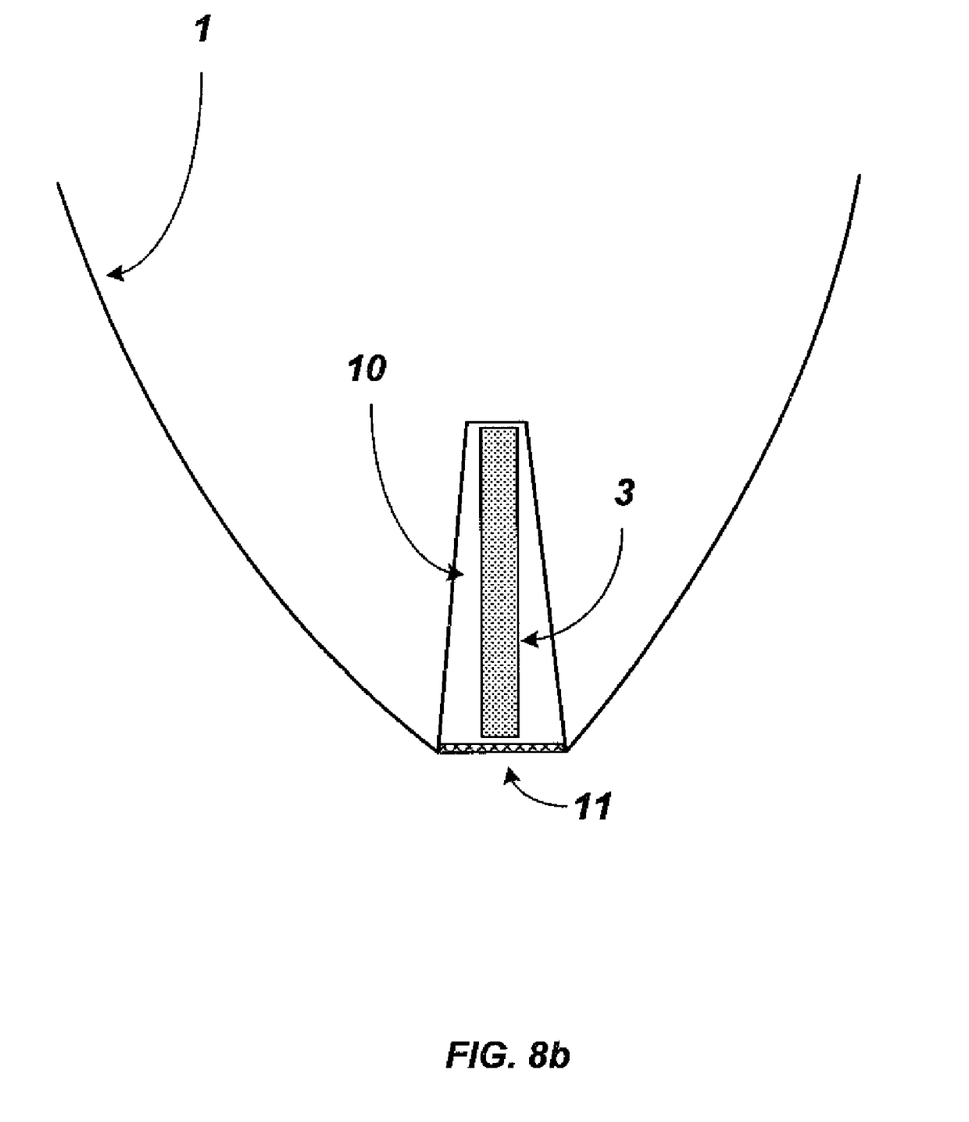
FIG. 8b is a cross-sectional view of the photovoltaic assembly of FIG. 8 wherein a plug may be employed to seal the indicated opening for the photovoltaic strip.

FIG. 8 is an orthogonal view of another photovoltaic device herein with detailed views of shown in FIGS. 8a and 8b. As can be seen, in this embodiment, the photovoltaic material may be positioned in an opening within the lens wherein two sides of the photovoltaic may be activated by light to produce electrical current. Non-imaging lenses such as the compound parabolic concentrator type can have various geometries with respect to the shape of the lens and the target of the concentrator. Often the target area is parallel to the upper surface of the lens, as has been described in other embodiments. However, other geometries are possible, such as a photovoltaic that may be vertically positioned with respect to the upper horizontal surface of the lens.

Accordingly, the sides of the lens opening may be vertical, or, depending on the shape of the concentrator lens, at an angle with respect to each other. Light may strike both sides of a vertical or angled photovoltaic target strip. In this embodiment, the photovoltaic material may be encapsulated in an opening at the bottom portion of the concentrating lens. The opening may be somewhat larger than the photovoltaic material itself to accommodate such strip. In this particular embodiment a transparent dielectric fluid may again fill the opening and again provide optical coupling between the lens and the photovoltaic material.

As the light may strike both sides of the concentrating lens, one may use any photovoltaic strip that provides two active surfaces for electrical generation. For example, one may utilize bi-facial crystalline silicon or thin film photovoltaic cells that provide such feature. For example, two strips of thin film photovoltaic or a wider thin film_strip folded in two may be employed.

Electrical connections may be as supplied by the photovoltaic material manufacturer or applied in a manner similar to other embodiments of the present invention. For example, the conductive metallic mesh can be used to conduct electricity off of the negative sides of the photovoltaic facing the light, while the positive contact will be either the back conductor of the thin film or the conductive contact of the crystalline silicon bi-facial cell.

The bottom of the opening may be sealed. This may be accomplished by the film described in other embodiments or by a plug. The plug may be small enough to be substantially outside of the optical path of the light and need not be transparent. It can again be made of the same or similar material to the lens, and joined to the lens by solvent welding, ultrasonic welding, thermal fusion or adhesives. It can also be made from a material different than the lens material and joined by an adhesive or other means.

Referring now specifically to FIG. 8, a lens 1 is again illustrated with an optical geometry designed to concentrate light on photovoltaic material 3 which photovoltaic may be in a generally vertical orientation with respect to a horizontal upper surface of the lens 1. The photovoltaic material 3 may be enclosed by an opening 10 formed or machined in the bottom of the lens 1. The sides of the opening 10 may be parallel or at an angle to each other. Space in the opening 10 not occupied by the photovoltaic material 3 may be filled by a transparent dielectric fluid (discussed above in other corresponding embodiments) to similarly provide electrical insulation, lubrication for differential expansion, moisture protection and/or optical coupling. The opening 10 itself may provide considerable physical protection for the photovoltaic material 3.

The bottom of the opening 10 may be sealed with the film 2, such as transparent film, as shown in FIG. 8a. Alternatively, the opening 10 may be sealed with a plug 11 that may be made of a material similar or dissimilar to that of lens 1 and joined by solvent welding, thermal fusion, ultrasonic welding, a mechanical connection, a force fit or adhesives as shown in FIG. 8b. Accordingly, as the plug 11 may be substantially out of the path of light to the concentrator target, and it need not be transparent.

The description and drawings illustratively set forth the presently preferred invention embodiments. The description and drawings are intended to describe these embodiments and not to limit the scope of the invention. Those skilled in the art will appreciate that still other modifications and variations of the present invention are possible in light of the above teaching while remaining within the scope of the following claims. Therefore one may practice the invention otherwise than as the description and drawings specifically shown and described.

What is claimed is:

1. A device for concentrating light onto a photovoltaic target, comprising:
   a transparent concentrating lens having a width and an elongated lengthwise side dimension with an outside surface including curved sides, an elongated lengthwise substantially flat top surface and an elongated lengthwise bottom portion wherein said bottom portion receives concentrated light and wherein said elongated lengthwise side dimension exceeds said width;
   a photovoltaic strip including a conducting strip; and
   a film engaged to at least a portion of said outside surface of said concentrating lens wherein said film engages said lens and positions said photovoltaic strip at said lens bottom portion;
   a transparent dielectric fluid located between said lens and said film, wherein said fluid is in contact with at least one of said photovoltaic strip and/or conducting strip.

2. The device of claim 1 including a backing strip for said photovoltaic strip.

3. The device of claim 1 wherein said lens comprises a transparent material that transmits greater than about 50% of visible light.

4. The device of claim 3 wherein said concentration lens has a refractive index and said fluid has a refractive index that is within +/−10% of the refractive index of said lens.

5. The device of claim 1 wherein said film material comprises a transparent material that transmits greater than about 50% of visible light.

6. The device of claim 1 wherein said dielectric fluid transmits greater than about 50% of visible light.

7. The device of claim 1 wherein said film material when adhered to said lens is capable of providing total internal reflection of said concentrated light.

8. The device of claim 1 wherein said lens has a side portion and said conducting strip extends from said photovoltaic strip to said side portion.

9. The device of claim 1 wherein said conducting strip provides light reflection.

10. The device of claim 1 wherein said conducting strip is in the form of a metallic mesh.

11. The device of claim 1 wherein said photovoltaic strip including said conducting strip extends beyond said lengthwise side dimension.

12. The device of claim 1 wherein said dielectric fluid comprises a hydrophobic fluid.

13. A device for concentrating light onto a photovoltaic target, comprising:
   a concentrating lens having a refractive index including a transparent material and having a width and an elongated lengthwise side dimension with an outside surface including curved sides, an elongated lengthwise substantially flat top surface and an elongated lengthwise bottom portion, wherein said bottom portion receives concentrated light and wherein said elongated lengthwise side dimension exceeds said width;
   a photovoltaic strip including a conducting strip;
   a transparent film engaged to at least a portion of said outside surface of said concentrating lens wherein said film engages said lens and positions said photovoltaic strip at said lens bottom portion; and
   a transparent dielectric fluid located between said lens and said film, wherein said dielectric fluid has a refractive index that is within +/−20% of the refractive index of said lens wherein said fluid is in contact with at least one of said photovoltaic strip and/or conducting strip.

14. The device of claim 13 wherein said film material when adhered to said lens is capable of providing total internal reflection of said concentrated light.

15. The device of claim 13 wherein said lens has a side portion and said conducting strip extends from said photovoltaic strip to said side portion.

16. The device of claim 13 wherein said conducting strip provides light reflection.

17. The device of claim 13 wherein said conducting strip is in the form of a metallic mesh.

18. The device of claim 13 wherein said dielectric fluid comprises a hydrophobic fluid.

19. A device for concentrating light onto a photovoltaic target comprising:
- a transparent concentrating lens having a width and an elongated lengthwise side dimension with an outside surface including curved sides, an elongated lengthwise substantially flat top surface and an elongated lengthwise bottom portion wherein said bottom portion receives concentrated light and wherein said bottom portion includes an opening and wherein said elongated lengthwise side dimension exceeds said width;
- a photovoltaic strip including a conducting strip positioned in said opening;
- a film material engaged to at least a portion of said outside surface of said concentrating lens; and
- wherein said opening is sealed and contains a transparent dielectric fluid wherein said fluid is located between said lens and said film, and said fluid is in contact with at least one of said photovoltaic strip and/or conducting strip.

20. The device of claim 19 wherein said film seals said opening.

21. The device of claim 19 wherein said photovoltaic strip is configured in said opening so that said photovoltaic strip provides two surfaces for generation of an electrical current.

22. The device of claim 19 wherein said dielectric fluid comprises a hydrophobic fluid.

23. A method for forming a photovoltaic device comprising:
- providing a concentrating lens including a transparent material and having a width and an elongated lengthwise side dimension with an outside surface including curved sides, an elongated lengthwise substantially flat top surface and an elongated lengthwise bottom portion wherein said bottom portion receives concentrated light and wherein said elongated lengthwise side dimension exceeds said width;
- providing a photovoltaic strip including a conducting strip;
- engaging a film to at least a portion of said outside surface of said concentrating lens wherein said film engages said lens and positions said photovoltaic strip at said bottom location of said concentration lens; and
- providing a transparent dielectric fluid between said lens and said film in an area where the surfaces of said film and said lens are not adhered wherein said fluid contacts with at least one of said photovoltaic strip and/or conducting strip.

24. The method of claim 23 including positioning a metallic backing onto said photovoltaic strip.

* * * * *